US012808082B2

(12) United States Patent
Ho et al.

(10) Patent No.: US 12,808,082 B2
(45) Date of Patent: Nov. 24, 2026

(54) HIGH-PERFORMANCE PHOTODETECTOR BASED ON TWO-DIMENSIONAL PEROVSKITE CRYSTALS WITH ALTERNATING INTERLAYER CATIONS

(71) Applicant: City University of Hong Kong, Hong Kong (HK)

(72) Inventors: Johnny Chung Yin Ho, Hong Kong (HK); Yezhan Li, Hong Kong (HK); You Meng, Hong Kong (HK); Zhengxun Lai, Hong Kong (HK); Quan Quan, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 317 days.

(21) Appl. No.: 18/631,022

(22) Filed: Apr. 9, 2024

(65) Prior Publication Data

US 2025/0154683 A1 May 15, 2025

Related U.S. Application Data

(60) Provisional application No. 63/597,347, filed on Nov. 9, 2023.

(51) Int. Cl.
*C30B 7/14* (2006.01)
*C30B 29/12* (2006.01)

(52) U.S. Cl.
CPC ................ *C30B 29/12* (2013.01); *C30B 7/14* (2013.01)

(58) Field of Classification Search
CPC . C30B 29/12; C30B 7/14; H01G 9/00; H01G 9/20
See application file for complete search history.

(56) References Cited

U.S. PATENT DOCUMENTS

2018/0334759 A1* 11/2018 Wei ......................... C30B 29/12
2023/0323200 A1* 10/2023 Emrick .................. H10K 85/50 252/301.4 H

FOREIGN PATENT DOCUMENTS

CN 110229070 A * 9/2019 ........... C07C 211/04
CN 115044982 A * 9/2022 ............ C30B 29/54

OTHER PUBLICATIONS

Zhang et al "Efficient Blue Perovskite Light-Emitting Diodes Boosted by 2D/3D Energy Cascade Channels" Advance Function Materials 2020, 30, 2001732.*

(Continued)

*Primary Examiner* — Robert M Kunemund
(74) *Attorney, Agent, or Firm* — IDEA Intellectual Limited; Sam T. Yip

(57) ABSTRACT

In this invention, a high-performance photodetector based on 2D bilayered hybrid lead halide perovskite single crystal with ACI phase, with a chemical formula of $GAMA_2Pb_2I_7$ where GA is $C(NH_2)_3$ and MA is $CH_3NH_3$,) was fabricated, using a facile and cost-effective method based on cooling crystallization. The single-crystal photodetector exhibits high photoresponsivity, together with correspondingly high detectivity values. Meanwhile, a high-resolution imaging sensor is built based on the $GAMA_2Pb_2I_7$ single-crystal photodetector, confirming the high stability and photosensitivity of the imaging system.

6 Claims, 35 Drawing Sheets

(56) References Cited

OTHER PUBLICATIONS

Gao et al."Pressure-Tuned Multicolor Emission of 2D Lead Halide Perovskites with Ultrahigh Color Purity" Angew. Chem. Int. Ed. 2023, 62, e202218675.*
Tingting ZHU et al., Multilayered Alternating-Cations-Intercalation Chiral Hybrid Perovskites with High Circular Polarization Sensitivity, Small, 2022. Vol. 18, No. 2203571, p. 1-7.
Wentao WU et al., Tailoring the Distinctive Chiral-Polar Perovskites with Alternating Cations in the Interlayer Space for Self-Driven Circularly Polarized Light Detection, Advanced Optical Materials, 2022, vol. 10, No. 2102678, p. 1-6.
Meng YUAN et al., Ultrasensitive Photodetectors Based on Strongly Interacted Layered-Perovskite Nanowires, ACS Applied Materials & Interfaces, 2022, vol. 14, p. 1601-1608.
Rinku SARAN et al., Lead sulphide nanocrystal photodetector technologies, Nature Photonics, 2016, vol. 10, p. 81-92.
Fang WANG et al., Recent Progress on Electrical and Optical Manipulations of Perovskite Photodetectors, Advanced Science News, 2021, vol. 8, No. 2100569, p. 1-15.
You MENG et al., Direct Vapor-Liquid-Solid Synthesis of All-Inorganic Perovskite Nanowires for High-Performance Electronics and Optoelectronics, ACS Nano, 2019, vol. 13, p. 6060-6070.
Siu-Fung LEUNG et al., A Self-Powered and Flexible Organometallic Halide Perovskite Photodetector with Very High Detectivity, Advanced Materials, 2018, vol. 30, No. 1704611, p. 1-8.
Yihan CHEN et al., Switch type PANI/ZnO core-shell microwire heterojunction for UV photodetection, Journal of Materials Science & Technology, 2022, vol. 105, p. 259-265.
Fan HUANG et al., High- and Reproducible-Performance Graphene/II-VI Semiconductor Film Hybrid Photodetectors, Scientific Reports, 2016, vol. 6, No. 28943, p. 1-8.
Jurgen MICHEL et al., High-performance Ge-on-Si photodetectors, Nature Photonics, 2010, vol. 4, p. 527-534.
Zhihong HUANG et al., Microstructured silicon photodetector, Applied Physics Letters, 2006, vol. 89, No. 033506, p. 1-3.
Fengnian Xia et al., Ultrafast graphene photodetector, Nature Nanotechnology, 2009, vol. 4, p. 839-843.
Jiang Wang et al., Progress in ultraviolet photodetectors based on II-VI group compound semiconductors, Journal of Materials Chemistry C, 2022, vol. 10, p. 12929-12946.
Chih-Han Chen et al., Novel fabrication of UV photodetector based on ZnO nanowire/p-GaN heterojunction, Chemical Physics Letters, 2009, vol. 476, p. 69-72.
Jiang Wu et al., Intersublevel Infrared Photodetector with Strain-Free GaAs Quantum Dot Pairs Grown by High-Temperature Droplet Epitaxy, Nano Letters, 2010, vol. 10, p. 1512-1516.
Takumi Yamada et al., Photon recycling in perovskite CH3NH3PbX3 (X = I, Br, Cl) bulk single crystals and polycrystalline films, Journal of Luminescence, 2020, vol. 220, No. 116987, p. 1-6.
Feng Zhang et al., Brightly Luminescent and Color-Tunable Colloidal CH3NH3PbX3 (X = Br, I, Ci) Quantum Dots: Potential Alternatives for Display Technology, ACS Nano, 2015, vol. 9, No. 4, p. 4533-4542.
Simone Meloni et al., Ionic polarization-induced current-voltage hysteresis in CH3NH3PbX3 perovskite solar cells, Nature Communications, 2015, vol. 7, No. 10334, p. 1-9.
Nam LE et al., Morphological improvement of CH3NH3Pbl3 films using blended solvents for perovskite solar cells, Korean J. Chem. Eng., 2021, vol. 38, No. 1, p. 187-194.
Victoria Gonzalez-Pedro et al., General Working Principles of CH3NH3PbX3 Perovskite Solar Cells, Nano Letters, 2014, vol. 14, p. 888-893.
Yi Hou et al., Efficient tandem solar cells with solution-processed perovskite on textured crystalline silicon, Science, 2020, vol. 367, p. 1135-1140.
Andrew Barnabas Wong et al., Growth and Anion Exchange Conversion of CH3NH3PbX3 Nanorod Arrays for Light-Emitting Diodes, Nano Letters, 2015, vol. 15, p. 5519-5524.
Ivy M. Asuo et al., High-performance pseudo-halide perovskite nanowire networks for stable and fast-response photodetector, Nano Energy, 2018, vol. 51, p. 324-332.
Wei Tian et al., Hybrid Organic-Inorganic Perovskite Photodetectors, Small, 2017, vol. 13, No. 1702107, p. 1-22.
Andrea Ciccioli et al., Thermodynamics and the Intrinsic Stability of Lead Halide Perovskites CH3NH3PbX3, The Journal of Physical Chemistry Letters, 2018, vol. 9, p. 3756-3765.
Byung-wook Park et al., Intrinsic Instability of Inorganic-Organic Hybrid Halide Perovskite Materials, Advanced Materials, 2019, vol. 31, No. 1805337, p. 1-17.
Kai Wang et al., Quasi-Two-Dimensional Halide Perovskite Single Crystal Photodetector, ACS Nano, 2018, vol. 12, p. 4919-4929.
Lina LI et al., Tailored Engineering of an Unusual (C4H9NH3)2(CH3NH3)2Pb3Br10 Two-Dimensional Multilayered Perovskite Ferroelectric for a High-Performance Photodetector, Angewandte Chemie, 2017, vol. 129, p. 12318-12322.
Eugenia S. Vasileiadou et al., Insight on the Stability of Thick Layers in 2D Ruddlesden-Popper and Dion-Jacobson Lead Iodide Perovskites, Journal of the American Chemical Society, 2021, vol. 143, p. 2523-2536.
Changyong LAN et al., Two-dimensional perovskite materials: From synthesis to energy-related applications, Materials Today Energy, 2019, vol. 11, p. 61-82.
Jiachen Zhou et al., Photodetectors Based on Two-Dimensional Layer-Structured Hybrid Lead Idide Perovskite Semiconductors, ACS Applied Materials & Interfaces, 2016, vol. 8, p. 25660-25666.
Xiangxin Tian et al., Two-dimensional organic-inorganic hybrid Ruddlesden-popper perovskite materials: reparation, enhanced stability, and applications in photodetection, Sustainable Energy & Fuels, 2020, vol. 4, p. 2087-2113.
Zhenjun Tan et al., Two-Dimensional (C4H9NH3)2PbBr4 Perovskite Crystals for High-Performance Photodetector, Journal of the American Chemical Society, 2016, vol. 138, p. 16612-16615.
Yuhai Zhang et al., Zero-Dimensional Cs4PbBr6 Perovskite Nanocrystals, The Journal of Physical Chemistry Letters, 2017, vol. 8, p. 961-965.
Bin-Bin Zhang et al., High-Performance X-ray Detection Based on One-Dimensional Inorganic Halide Perovskite CsPbl3, The Journal of Physical Chemistry Letters, 2020, vol. 11, p. 432-437.
Hsin-Ping Wang et al., Low-Dimensional Metal Halide Perovskite Photodetectors, Advanced Materials, 2021, vol. 33, No. 2003309, p. 1-42.
Tao Luo et al., Compositional Control in 2D Perovskites with Alternating Cations in the Interlayer Space for Photovoltaics with Efficiency over 18%, Advanced Materials, 2019, vol. 31, No. 1903848, p. 1-8.
Supriya Ghosh et al., Investigation of Many-Body Exciton Recombination and Optical Anisotropy in Two-Dimensional Perovskites Having Different Layers with Alternating Cations in the Interlayer Space, The Journal of Physical Chemistry C, 2021, vol. 125, p. 7799-7807.
Chan Myae Myae SOE et al., New Type of 2D Perovskites with Alternating Cations in the Interlayer Space, (C(NH2)3)(CH3NH3)nPbnl3n+1: Structure, Properties, and Photovoltaic Performance, Journal of the American Chemical Society, 2017, vol. 139, p. 16297-16309.
Jun Yang et al., Stable 2D Alternating Cation Perovskite Solar Cells with Power Conversion Efficiency >19% via Solvent Engineering, Solar RRL, 2021, vol. 5, No. 2100286, p. 1-8.
Yiyue Zhang et al., Two-dimensional perovskites with alternating cations in the interlayer space for stable light-emitting diodes, Nanophotonics, 2021, vol. 10, p. 2145-2156.
Gregor Kieslich et al., An extended tolerance factor approach for organic-inorganic perovskites, Chemical Science, 2015, vol. 6, p. 3430-3433.
J. Tauc et al., Optical Properties and Electronic Structure of Amorphous Germanium, Phys. Status Solidi B, 1966, vol. 15, p. 627-637.
Yunxi Zhou et al., Exciton-Phonon Interaction-Induced Large In-Plane Optical Anisotropy in Two-Dimensional All-Inorganic Perovskite Crystals, The Journal of Physical Chemistry Letters, 2021, vol. 12, p. 3387-3392.
Junze Li et al., Anisotropy of Excitons in Two-Dimensional Perovskite Crystals, ACS Nano, 2020, vol. 14, p. 2156-2161.

(56) References Cited

OTHER PUBLICATIONS

Xinyi Niu et al., Centimeter-sized single crystals of 2D hybrid perovskites toward ultraviolet photodetection with anisotropic photoresponse, Materials Chemistry Frontiers, 2022, vol. 6, p. 3598-3604.

C. Soci et al., ZnO Nanowire UV Photodetectors with High Internal Gain, Nano Letters, 2007, vol. 7, No. 4, p. 1003-1009.

Oriol Lopez-Sanchez et al., Ultrasensitive photodetectors based on monolayer MoS2, Nature Nanotechnology, 2013, vol. 8, p. 497-501.

* cited by examiner

HIGH-PERFORMANCE PHOTODETECTOR BASED ON TWO-DIMENSIONAL PEROVSKITE CRYSTALS WITH ALTERNATING INTERLAYER CATIONS

CROSS-REFERENCE TO RELATED APPLICATIONS

The present application claims priority from a U.S. provisional patent application Ser. No. 63/597,347 filed Nov. 9, 2023, and the disclosure of which are incorporated by reference in their entirety.

FIELD OF THE INVENTION

The present invention generally relates to the field of photodetectors. More specifically, the present invention relates to a photodetector with enhanced performance, based on 2D bilayered hybrid lead halide perovskite single crystal with ACI phase.

BACKGROUND OF THE INVENTION

Photodetectors (PDs), which can directly convert optical signals into electrical signals, play a significant part in imaging, security systems, industrial inspection, and so on. To fabricate high-performance PDs, a semiconductor with a good ability to absorb incident photons and then produce photogenerated carriers effectively is indispensable. So far, various types of semiconductors, including silicon, group II-VI compounds, group III-V compounds, and organics, have been extensively explored for use in PDs.

However, these semiconductor materials usually require relatively complicated and expensive ways to synthesize, in which the epitaxy and vapor-liquid-solid (VLS) mechanisms are usually involved. Thus, it is urgent to discover new promising candidates to further design the photodetector with high performance, low cost, and case of fabrication.

Recently, the three-dimensional (3D) organic-inorganic hybrid lead halide perovskites in the forms of $CH_3NH_3PbX_3$ (X═I, Br, Cl) have received intense attention owing to their low-cost fabrication and excellent optoelectronic properties. As a result, they have impressive developments, especially in the high-efficient perovskite solar cells. To date, a certified photovoltaic power conversion efficiency (PCE) of hybrid perovskite solar cells has approached 25.7% (until March. 2023), which is higher than that of many reported conventional thin-film solar cells, organic photovoltaics, and dye-sensitized solar cells.

Moreover, this kind of material with excellent features has also attracted enormous attention in other optoelectronic devices, such as lasers, transistors, and light-emitting diodes (LEDs). Especially, perovskites have been examined for high-performance wide-spectrum photodetection from X-ray, UV, visible, to near-infrared light. However, the poor stability of these 3D perovskite-based devices hinders their further commercial applications.

Using short alkyl ammonium or aromatic ammonium cations to low-dimensional perovskites is an effective method to balance device stability and performance. Based on this route, plenty of perovskites with different dimensions, including zero-dimension (0D), one-dimension (1D), and two-dimension (2D), were synthesized. Among them, 2D perovskite shows better optoelectronic performance when compared with 0D and 1D perovskite due to their layered structure being analogue to the conventional 3D perovskites.

From a structural perspective, 2D layered hybrid perovskites could be classified into three types: Dion-Jacobson (DJ), Ruddlesden-Popper (RP), and the newly discovered alternating cations in the interlayer (ACI) types. The 2D ACI perovskite described by the formula $(C(NH_2)_3)(CH_3NH_3)_nPb_nI_{3n+1}$, featuring two different alternating organic cations in the interlayer space, was recently presented.

Compared to the more common DJ-phase and RP-phase layered hybrid perovskites, the perovskite with ACI phase adopts the short organic cations between inorganic layers, which decrease the bandgap and exciton binding energy, being favorable for the performance improvement of optoelectronic devices. For example, a stable 2D ACI perovskite solar cells is reported with superior PCE exceeding 19.00%. In addition, a LED made of the ACI perovskites was successfully fabricated, showing an external quantum efficiency (EQE) of 3.4% under high current density. In this regard, the 2D hybrid perovskites with ACI phase possess great potential for manufacturing high-performance photodetection with improved stability.

SUMMARY OF THE INVENTION

In view of the immense potential in the use of two-dimensional hybrid perovskites with ACI phase for high-performance photodetection, the present invention discloses a facile and cost-efficient method of synthesizing a novel 2D bilayered lead-halide hybrid perovskite single crystals with ACI phase, which has a chemical formula of $GAMA_2Pb_2I_7$, where GA is $C(NH_2)_3$ and MA is $CH_3NH_3$, based on a cooling crystallization method.

In accordance with a first aspect of the present invention, the method of synthesizing the two-dimensional lead-halide hybrid perovskites perovskite single crystals comprises adding a guanidine salt, a methylamine component and a lead salt into a solution of hypophosphorous acid ($H_3PO_2$) water solution and hydroiodic acid (HI). The mixture is subsequently heated to a temperature of 220° C. to 240° C. and stirring to remove all precipitation, stirred to remove all precipitation, and cooled to a room temperature of 15° C. to 25° C., where the saturated solution is cooled and desired crystals are formed by crystallization and obtained, with a yield of at least 70% relative to Pb.

In one embodiment of the first aspect of the invention, the guanidine salt is selected from guanidine carbonate, guanidine hydrochloride, guanidinium bromide, guanidinium iodide or guanidine phosphate, or any combinations thereof.

In another embodiment, the methylamine component is selected methylamine, methylamine hydrochloride, methylammonium bromide, or any combinations thereof.

In other embodiment, the lead salt is selected from lead carbonate, lead iodide, lead bromide, lead chloride, lead (II) acetate trihydrate, or any combinations thereof.

In an embodiment of the first aspect of the invention, the molar ratio of guanidine salt, lead salt and methylamine component is selected from a range of 1:1.5:1.5 to 1:2.5:2.5.

In another embodiment, the speed of cooling the mixture from a temperature of 65° C. to 85° C. to room temperature of 15° C. to 25° C. is 0.5° C./day to 2° C./day.

A photodetection device is also provided herewith, comprising the 2D bilayered lead-halide hybrid perovskite single crystals of $GAMA_2Pb_2I_7$, disposed on a substrate and having electrodes formed thereon.

In an embodiment of the second aspect of the invention, the electrodes are deposited on the two-dimensional bilayered lead-halide hybrid perovskite single crystals with ACI phase by a high-vacuum thermal evaporator at a thickness of 45 nm to 55 nm.

In a further embodiment, the electrodes comprise gold (Au).

In other embodiment, the substrate is selected from glass, ceramic, polymer, semiconductor or any combination thereof.

In another embodiment, the photoresponsivity of the device is at least 1.50 A/W under an incident light with a wavelength of 400 nm to 700 nm.

In yet another embodiment, the detectivity of the device is at least $1.50\times10^{12}$ Jones under an incident light with a wavelength of 400 nm to 700 nm.

BRIEF DESCRIPTIONS OF DRAWINGS

FIG. 1A shows the 2D bilayered crystal structures of $GAMA_2Pb_2I_7$. All hydrogen atoms are omitted. FIG. 1B shows the crystal structure viewed along the c-axis direction. FIG. 1C illustrates the powder XRD pattern and simulated XRD pattern of $GAMA_2Pb_2I_7$.

FIG. 2A shows the absorption spectra of $GAMA_2Pb_2I_7$ crystals, where the inset is the optical bandgap obtained by the Tauc plot method. FIG. 2B shows the DFT calculated band structure; and FIG. 2C shows the PDOS spectra of $GAMA_2Pb_2I_7$.

FIG. 3A is a schematic diagram of $GAMA_2Pb_2I_7$ photodetector architecture. FIG. 3B illustrates the XRD patterns of bulk single crystal of $GAMA_2Pb_2I_7$. FIG. 3C shows the normalized responsivity of the corresponding $GAMA_2Pb_2I_7$ photodetector under the 400-800 nm illumination light. FIGS. 3D, 3E and 3F shows the respective I-V curves of dark current and photocurrent under different incident power levels at −1.5 V (2=405, 532, and 635 nm respectively).

FIGS. 4A to 4I illustrate the performance of the $GAMA_2Pb_2I_7$ photodetector in the visible light spectrum. FIGS. 4A, 4B and 4C shows the I-T curves, photocurrent ($I_{ph}$), responsivity (R), detectivity (D) and EQE under illumination wavelengths of 405 nm. FIGS. 4D, 4E and 4F shows the I-T curves, photocurrent ($I_{ph}$), responsivity (R), detectivity (D) and EQE under illumination wavelengths of 532 nm. FIGS. 4G, 4H and 4I shows the I-T curves, photocurrent ($I_{ph}$), responsivity (R), detectivity (D) and EQE under illumination wavelengths of 635 nm.

FIG. 5A is a schematic diagram of the imaging system based on the $GAMA_2Pb_2I_7$ photodetector. FIG. 5B shows the corresponding imaging results from the fabricated $GAMA_2Pb_2I_7$ image sensor under a 532 nm laser.

FIG. 6. is a photograph of a $GAMA_2Pb_2I_7$ single crystal.

Figure 9A:
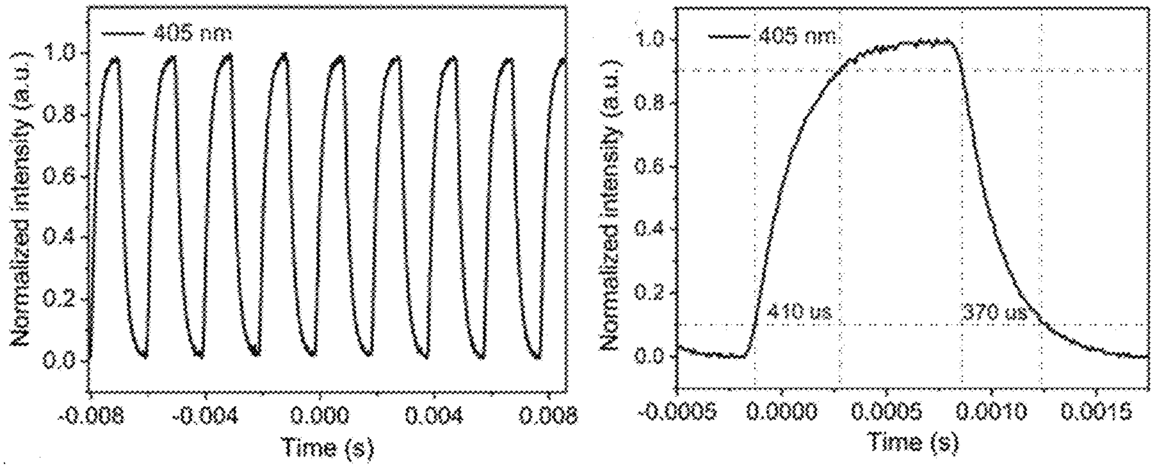
Figure 9B:
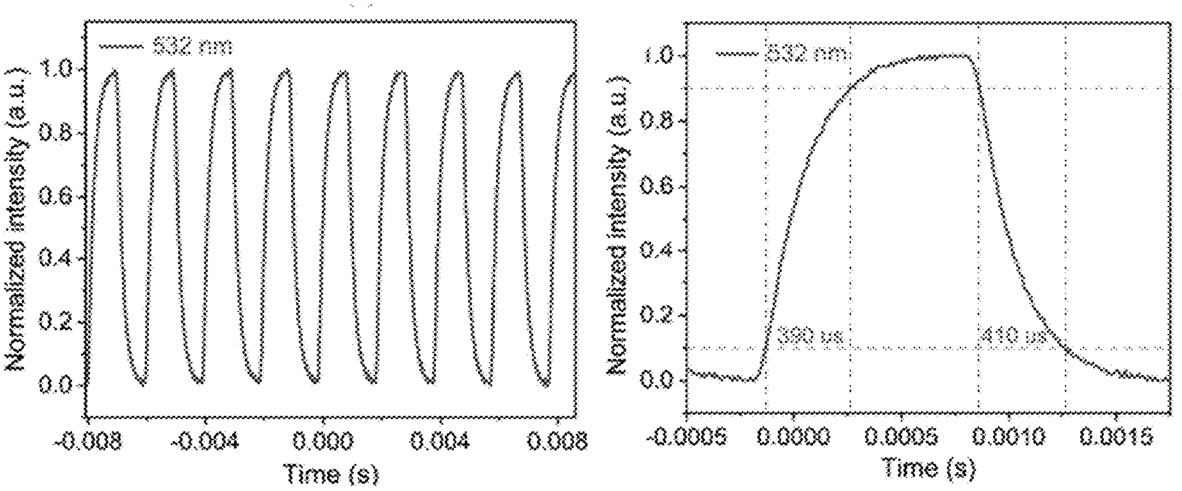
Figure 9C:
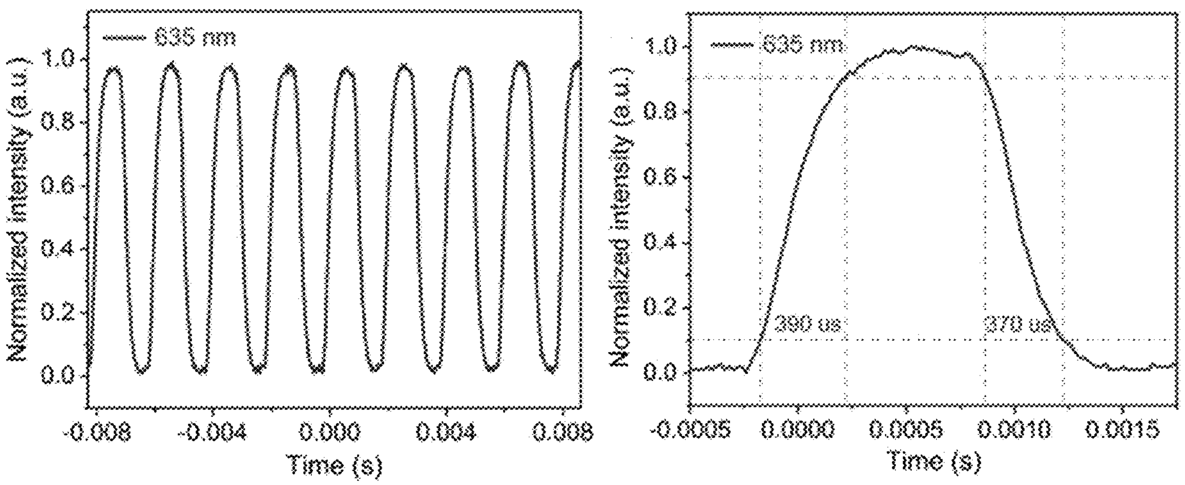

FIGS. 9A to 9C are time-resolved high-resolution I-T curves of $GAMA_2Pb_2I_7$ photodetecor. FIG. 9A shows I-T curves of the $GAMA_2Pb_2I_7$ photodetector under illumination wavelength of 405 nm. FIG. 9B SHOWS I-T curves of the $GAMA_2Pb_2I_7$ photodetector under illumination wavelength of 532 nm. FIG. 9C shows I-T curves of the $GAMA_2Pb_2I_7$ photodetector under illumination wavelength of 635 nm.

Figure 10:
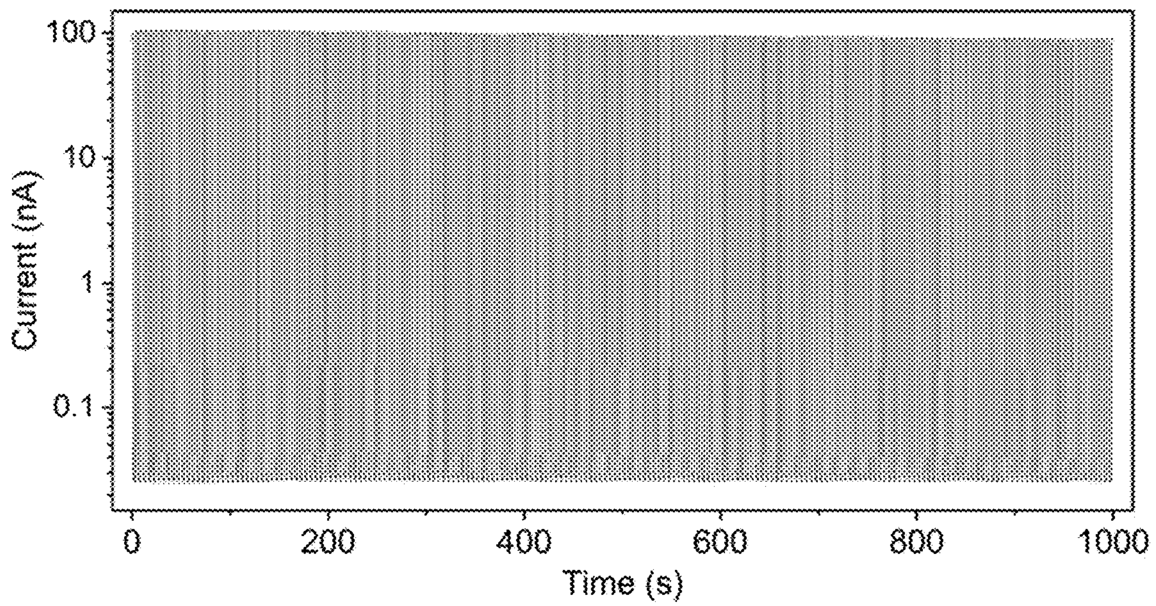

FIG. 10 shows the result of a long-term operating test of $GAMA_2Pb_2I_7$ photodetector under shopped 532 nm laser illumination.

Figure 11:
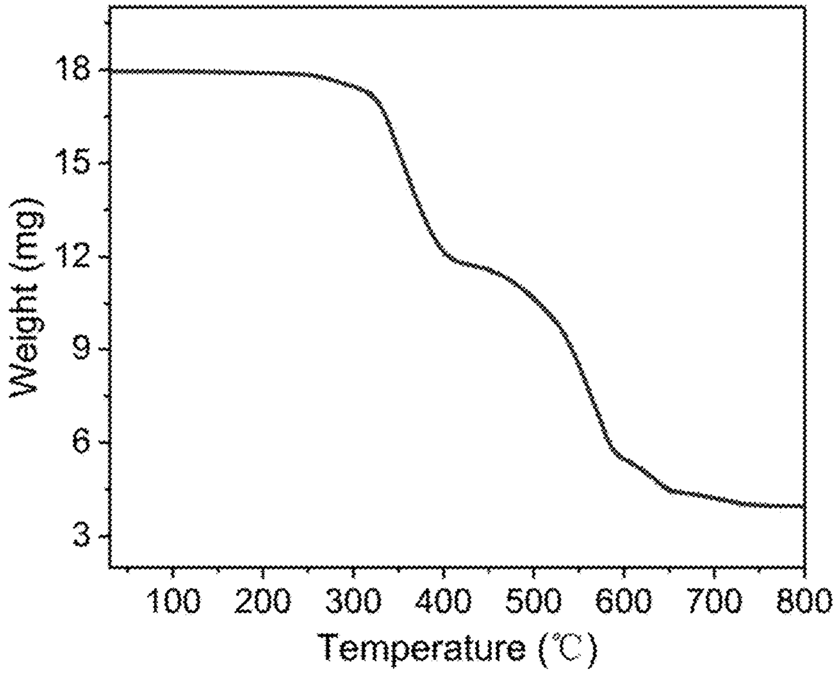

FIG. 11 illustrates the thermogravimetric analysis of $GAMA_2Pb_2I_7$ crystal.

Figure 12:
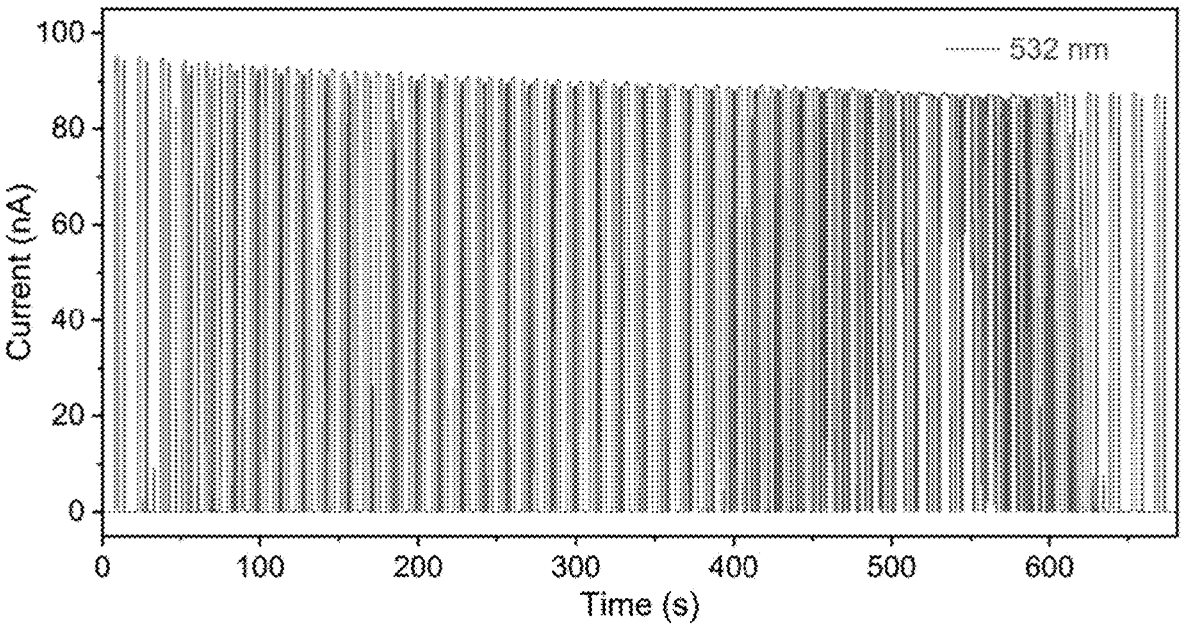

FIG. 12 shows the recorded spatially resolved photocurrent of $GAMA_2Pb_2I_7$ photodetector.

DETAILED DESCRIPTION

The present invention provides a method of synthesizing a novel two-dimensional bi-layered lead-halide hybrid perovskite single crystals with ACI phase, wherein the chemical formula of the two-dimensional bi-layered lead-halide hybrid perovskite single crystals with ACI phase is $GAMA_2Pb_2I_7$, (where GA is $C(NH_2)_3$ and MA is $CH_3NH_3$). The two-dimensional bi-layered lead-halide hybrid perovskite single crystals with ACI phase display higher crystal symmetry and narrowed bandgaps, which has a great potential in significant enhancement in photodetection performance.

ACI-phase perovskites have the formula $R'A_nB_nX_{3n+1}$, where the smaller cation R also fills the interlayer with another bulky 'R' cation. Most ACI-phase perovskites are formed by incorporating guanidinium ($GUA^+$) and $MA^+$ cations. The ACI-phase perovskite has an unprecedented structure that can be viewed as blending the chemical formula of the RP-phase perovskite with the structural features of the DJ-phase perovskite. Compared with the common RP-phase perovskites, ACI-phase perovskites have a different stacking motif and adopt a higher crystal symmetry, with a slightly narrower bandgap. As direct bandgap semiconductors are with wide valence and conduction bandwidths, ACI-phase perovskites show promising potential for photovoltaic applications.

Specifically, the synthesis method is based on cooling crystallization, which is highly facile in comparison with other existing 2D perovskite crystal synthesis methods, while maintaining a reasonably high yield of no lower than 70% in relation to Pb.

In addition, a photodetection device comprising the novel two-dimensional bi-layered lead-halide hybrid perovskite single crystals with ACI phase is also disclosed herewith, with a structure of $Au/GAMA_2Pb_2I_7/Au$, which exhibits high photoresponsivity and high detectivity values under incident light of wavelengths within the spectrum of visible light, i.e. approximately 400 nm-700 nm.

As the synthesis method of the novel two-dimensional bi-layered lead-halide hybrid perovskite single crystals with ACI phase could be performed with relatively low-cost apparatuses without the requirement of specific or harsh conditions, facile and cost-effective production of the photodetection device is possible.

In accordance with a first aspect of the present invention, the synthesis method involves adding guanidine carbonate salt (GA), methylamine hydrochloride (MA), and lead (II) acetate trihydrate into a solution containing hypophosphorous acid ($H_3PO_2$) and hydroiodic acid (HI). The resulting mixture undergoes heating to a temperature between 220° C. and 240° C., with continuous stirring to remove all precipitants. Subsequently, the mixture is cooled to room temperature (for example, a temperature range of approximately 15° C. to 25° C.) to obtain the crystallized products. The two-dimensional bi-layered lead-halide hybrid perovskite single crystals with ACI phase, denoted as $GAMA_2Pb_2I_7$, are formed, where GA represents $C(NH_2)_3$ and MA represents $CH_3NH_3$. The yield of these crystals with ACI phase is guaranteed to be at least 70% relative to lead (Pb).

A molar ratio of guanidine carbonate salt, lead (II) acetate trihydrate, and methylamine hydrochloride, may be within a range of 1:1.5:1.5 to 1:2.5:2.5 to optimize the synthesis process.

The cooling process involves a controlled speed from 65° C. to room temperature (15° C. to 25° C.) at 1° C./day, ensuring the gradual formation of the desired crystal structure.

Figure 3A:
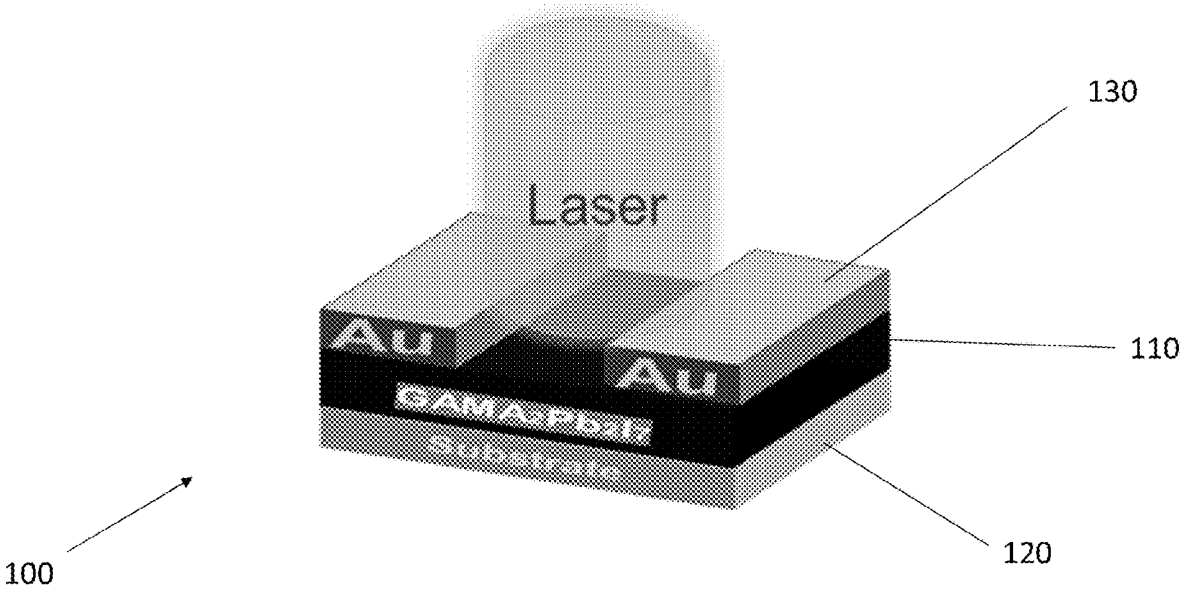

FIG. 3A schematically depicts a photodetection device 100. Device 100 includes a layer 110 of $GAMA_2Pb_2I_7$ on a substrate such as glass, a ceramic, polymer, or semiconductor substrate 120. Electrodes 130 are formed on the $GAMA_2Pb_2I_7$ layer. In the embodiment of FIG. 3A, gold electrodes are depicted; however, other conductive electrode materials may be used such as copper and aluminum, transparent electrodes such as indium tin oxide may also be employed. For the gold layer embodiment of FIG. 3A, the gold deposition is performed using a high-vacuum thermal evaporator, achieving a thickness ranging from 45 nm to 55 nm.

The photodetector of FIG. 3A is high photoresponsivity. For example, a minimum photoresponsivity of 1.50 A/W under an incident light with a wavelength of 400 nm to 700 nm and a minimum detectivity of $1.50\times10^{12}$ Jones under the same conditions.

The photodetector of FIG. 3A may be employed in a high-resolution imaging system The integration of the FIG. 3A photodetector into such an imaging system ensures the efficient detection of incident light, making the imaging system suitable for high-resolution applications.

EXAMPLES

Example 1. Synthesis of $GAMA_2Pb_2I_7$ Crystals

The 2D hybrid perovskite of $GAMA_2Pb_2I_7$ crystals was synthesized using guanidine carbonate salt ($C_2H_{10}N_6 \cdot CH_2O_3$, 99%, J&K Scientific), lead (II) acetate trihydrate ($C_4H_6O_4Pb \cdot {}_3H_2O$, 99%, Sigma-Aldrich), methylamine hydrochloride ($CH_5N \cdot HCl$, 99%, J&K Scientific), hypophosphorous acid ($H_3PO_2$, 50% (in mass) water solution, J&K Scientific) and hydroiodic acid (HI, 47%, Macklin). First, 5.4 g (59.5 mmol) guanidine carbonate salt, 4.02 g (30.0 mmol) methylamine hydrochloride, and 22.8 g (60.1 mmol) lead (II) acetate trihydrate were slowly added into a solution of 100 mL hydroiodic acid and 2 mL hypophosphorous acid. After that, a quick stir would mix them thoroughly at a temperature of 230° C. until there is no precipitation. The small $GAMA_2Pb_2I_7$ powder-like samples would appear when cooling to room temperature (20° C./h) as crystallized products. A yield of 76% was estimated relative to Pb. To allow the growth of crystallized products into the form of bulk perovskite crystals, a constant-speed temperature-programmable bath was used to control the cooling speed. After cooling the bath from 65° C. to room temperature (1° C./d), millimeter-level bulk crystals were obtained (see FIG. 6). The purity of these powder and single crystal samples was confirmed by a D2 PHASER XE-T X-ray Diffractometer System. The absorption spectra were obtained using a UV-3600i Plus UV-VIS-NIR spectrometer.

Example 2. Device Fabrication and Characterizations

To fabricate the photodetection device, Au electrodes with a thickness of 50 nm were deposited by a high-vacuum thermal evaporator with an evaporation rate of about 1.8 Å/s. In a shadow masking process, the length and width of the device channel were defined to be 65 μm and 15 μm, respectively. Room temperature I-V and I-T characteristics under different incident light wavelengths (405, 532, and 635 nm) were measured using a semiconductor analyzer (Agilent 4155C). The incident light power was calibrated by PM400, Thorlabs. To obtain the high-speed response time, precisely time-resolved I-T curves of the $GAMA_2Pb_2I_7$ device were recorded via a digital oscilloscope (Tektronix, TBS 1102B,) connected with a low-noise current preamplifier (Stanford Research Systems, SR570).

Example 3. Measured Material Properties

Figure 1A:
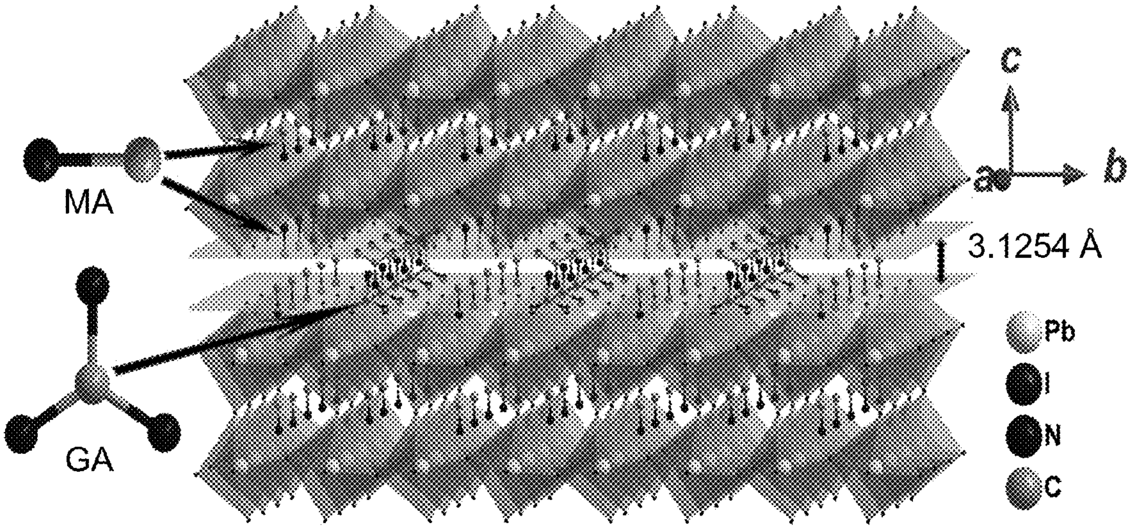
Figure 1B:
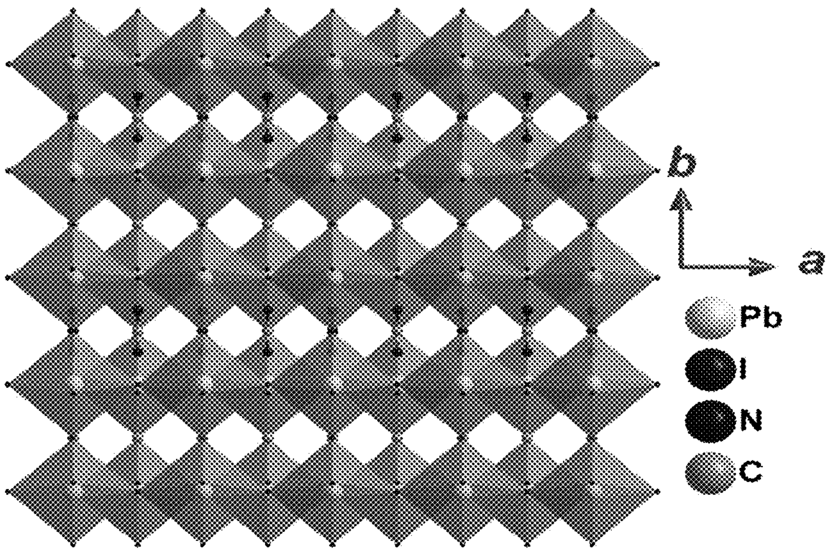
Figure 1C:
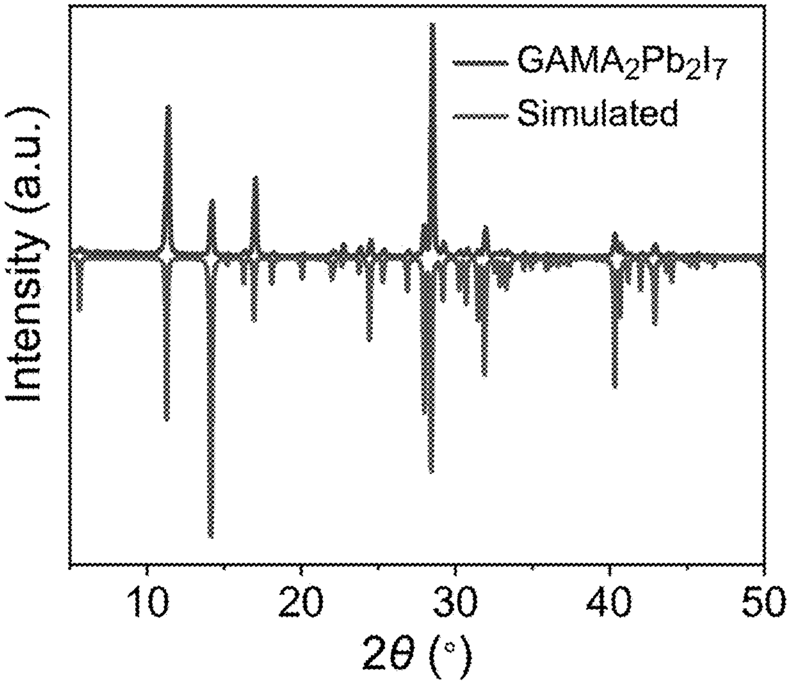
Figure 6:
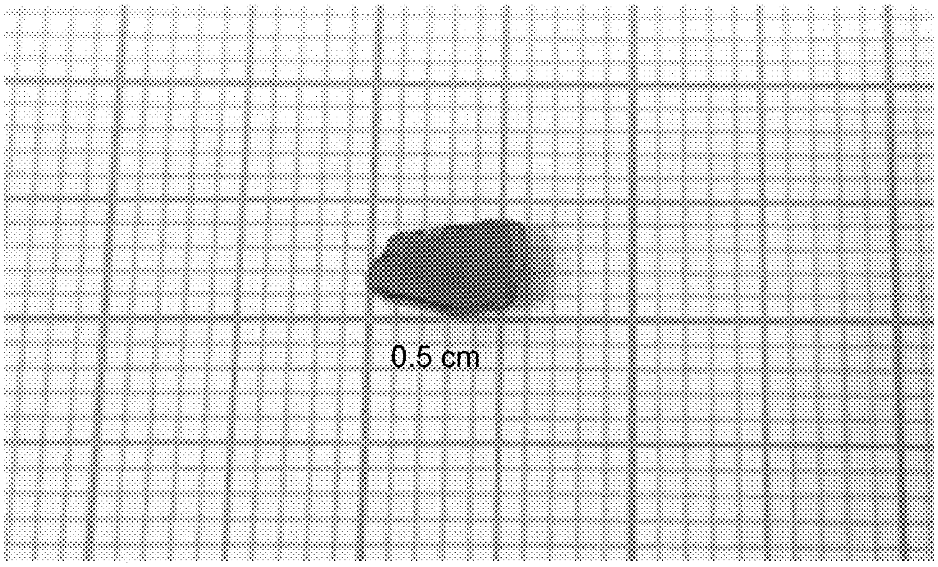
Figure 7A:
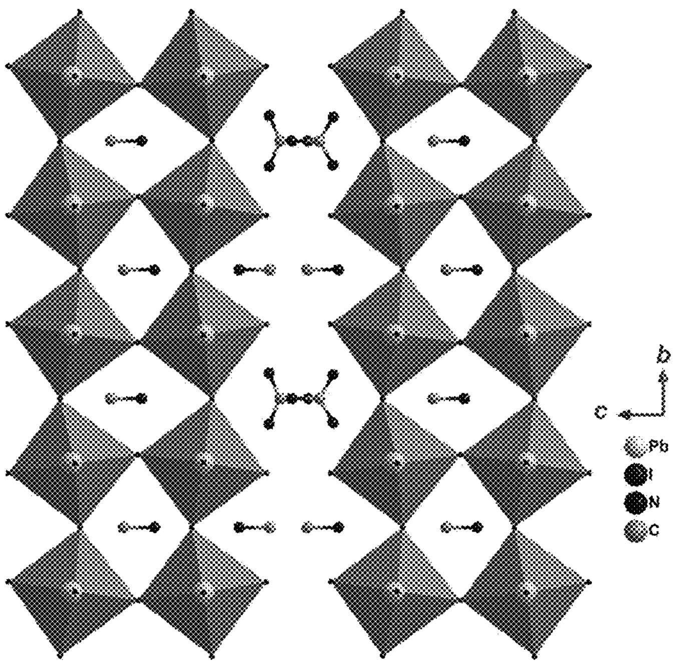
FIGS. 7A and 7B show the crystal structure of $GAMA_2Pb_2I_7$, viewed along the a-axis and b-axis respectively.
Figure 7B:
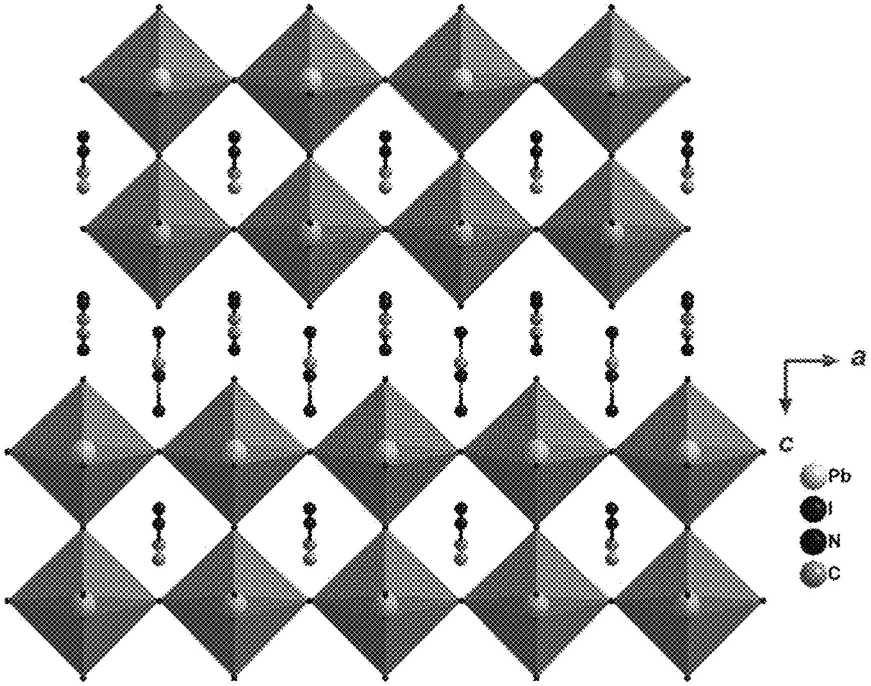
Figure 8A:
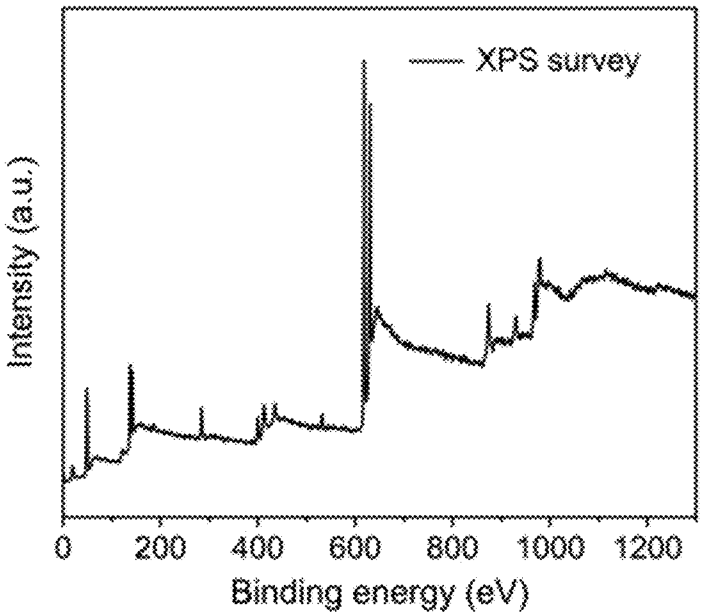
FIGS. 8A, 8B and 8C show the XPS results of the $GAMA_2Pb_2I_7$ single crystal.
Figure 8B:
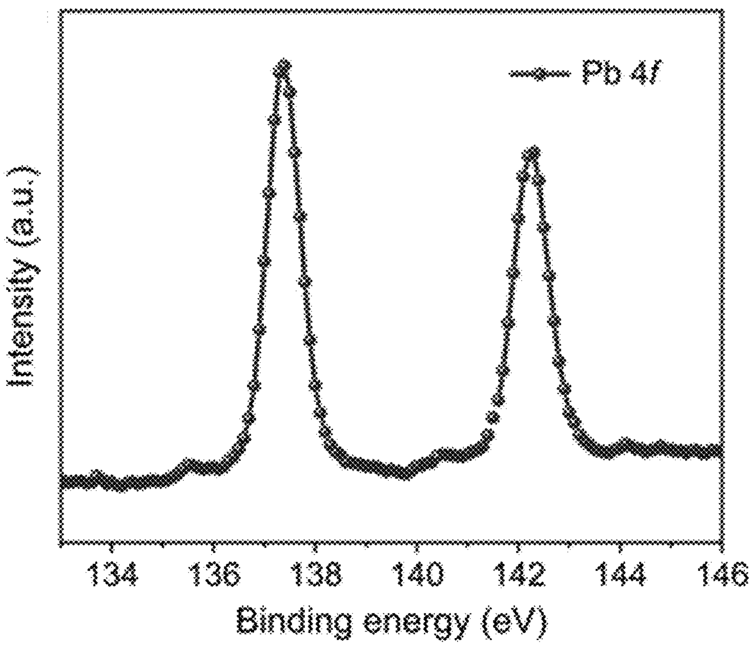
Figure 8C:
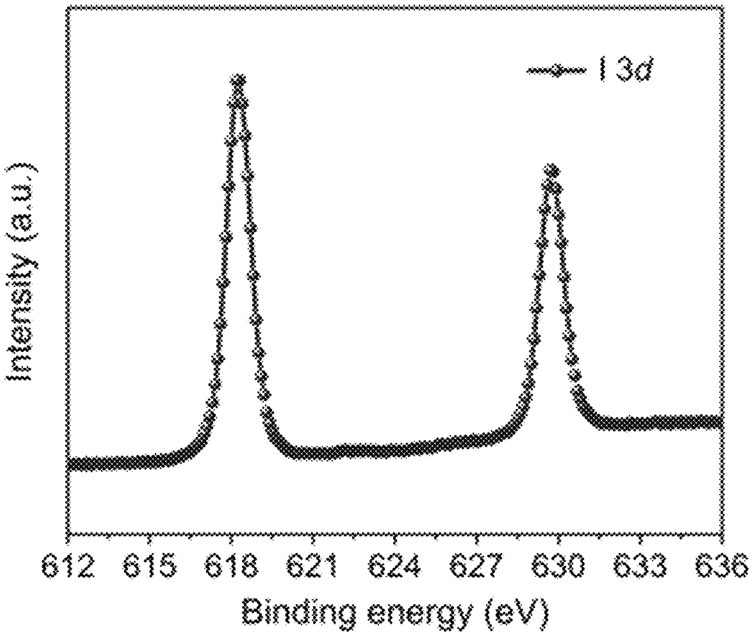

As the photograph shown in FIG. 6, black-color single crystals of $GAMA_2Pb_2I_7$ were grown from its saturated solution through the cooling crystallization method. The measured PXRD pattern agrees well with the simulation result, which confirms its crystal structure (FIG. 1C). Single-crystal structural analysis discovers that it crystallizes in the space group No. 38, orthorhombic Bmm2 at 293 K. FIG. 1A illustrates 2D ACI perovskite structure, where the layered parts contain corner-sharing $[Pb_2I_7]^{\infty}$ bilayers and $MA^+$ cations, which pile up along the c-axis. Meanwhile, $GA^+$ and interlayer $MA^+$ organic cations are ordered packing between the perovskite layers and linked to the infinite bilayered perovskite via N—H···I hydrogen bonds. Especially, due to the small ionic radius of MA (217 pm) and GA (278 pm), the distance between $[Pb_2I_7]^{\infty}$ inorganic layers is as short as 3.1254 Å. It is noted that such short interlayer distance has a significant impact on their optoelectronic properties, altering their bandgap and dielectric confinement in 2D hybrid perovskites.

Figure 2A:
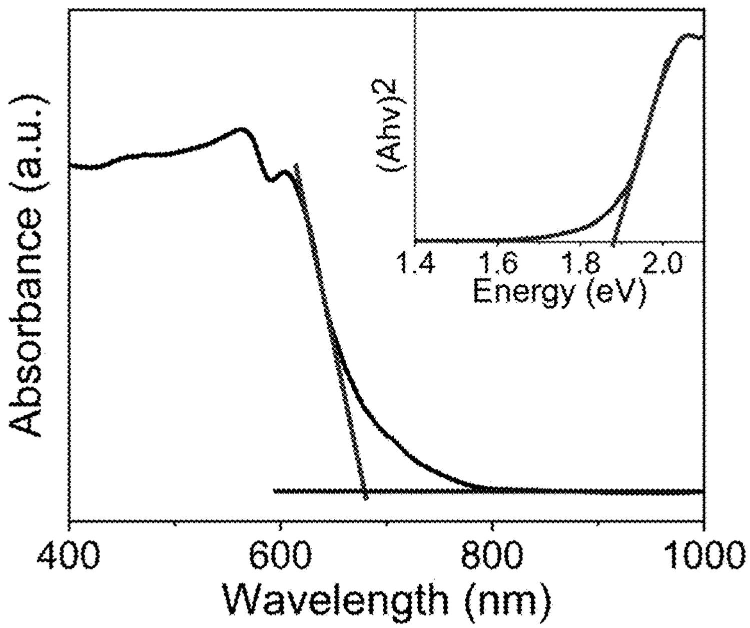
Figure 2B:
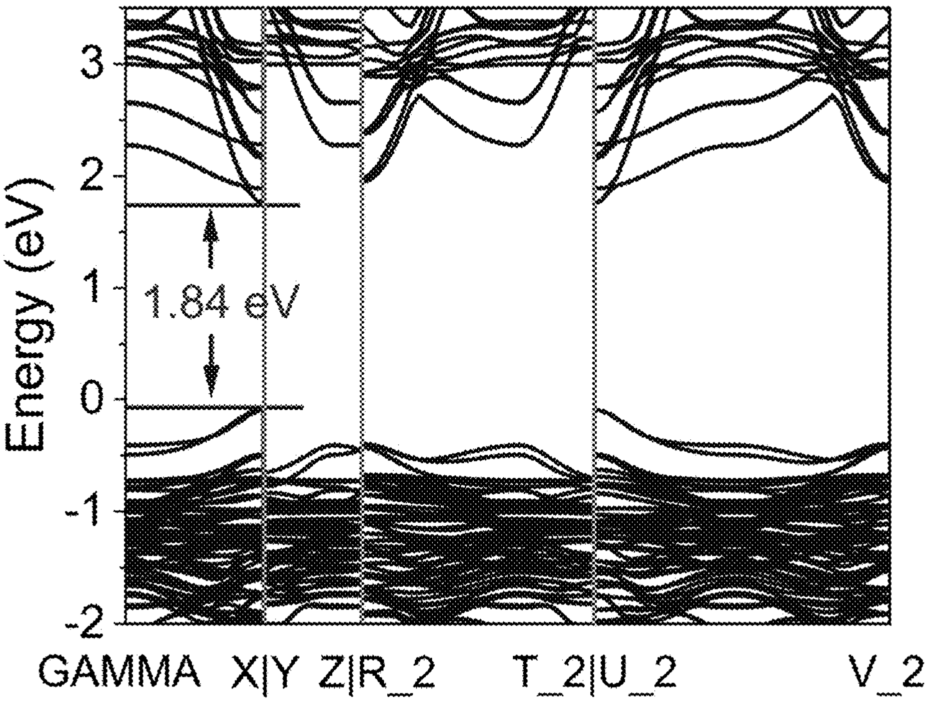
Figure 2C:
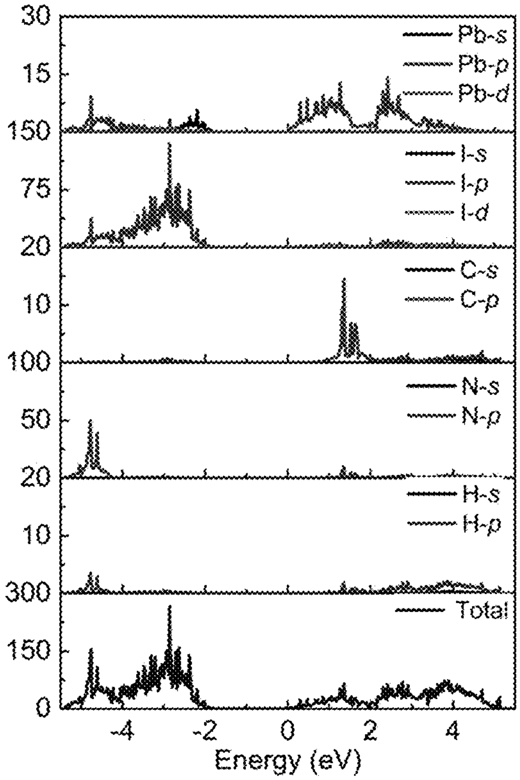

As the ultraviolet-visible absorption spectrum shown in FIG. 2A, the absorption edge at 680 nm indicates that $GAMA_2Pb_2I_7$ could absorb wide-band visible light. Besides, the optical bandgap is determined by the Tauc plot method, and the estimated value extracted from the Tauc plot is 1.88 eV (the inset of FIG. 2A). Meanwhile, we evaluate the band structures and electronic properties of $GAMA_2Pb_2I_7$ crystals by using the first-principles density functional theory (DFT). (FIG. 2B). Both the conduction band maximum (CBM) and valence band minimum (VBM) are obviously located at the same point, which confirms that $GAMA_2Pb_2I_7$ belongs to a kind of direct bandgap semiconductor. The calculated bandgap value of 1.84 eV matches well with the experimental value. Furthermore, the partial density of states (PDOS) spectra demonstrate that the unoccupied I-p orbitals contribute to the VBM, while the Pb-p orbitals contribute to the CBM (FIG. 2C).

Figure 3B:
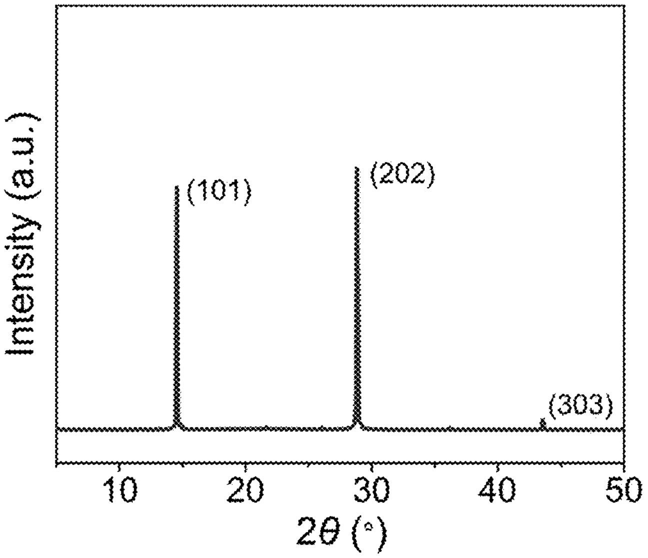

Based on the good material properties, single-crystal $GAMA_2Pb_2I_7$ photodetectors were constructed using Au as electrodes and glass as a substrate, where the planar device configuration is shown in FIG. 3A. The detailed device fabrication processes were displayed in the experimental section. As the photodetector was made by bulk perovskite single crystal, the crystal anisotropy needs to be taken into consideration. As shown in FIG. 3B, the XRD pattern of the single crystal $GAMA_2Pb_2I_7$ exhibits periodically repeated diffraction peaks corresponding to the (101) plane group, demonstrating the high degree of orientation of the formed $GAMA_2Pb_2I_7$ single crystal.

Figure 3C:
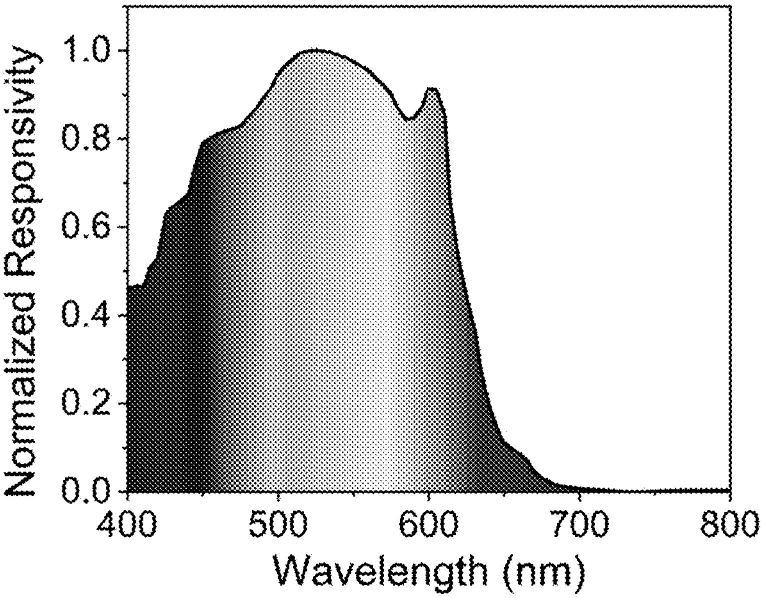
Figure 3D:
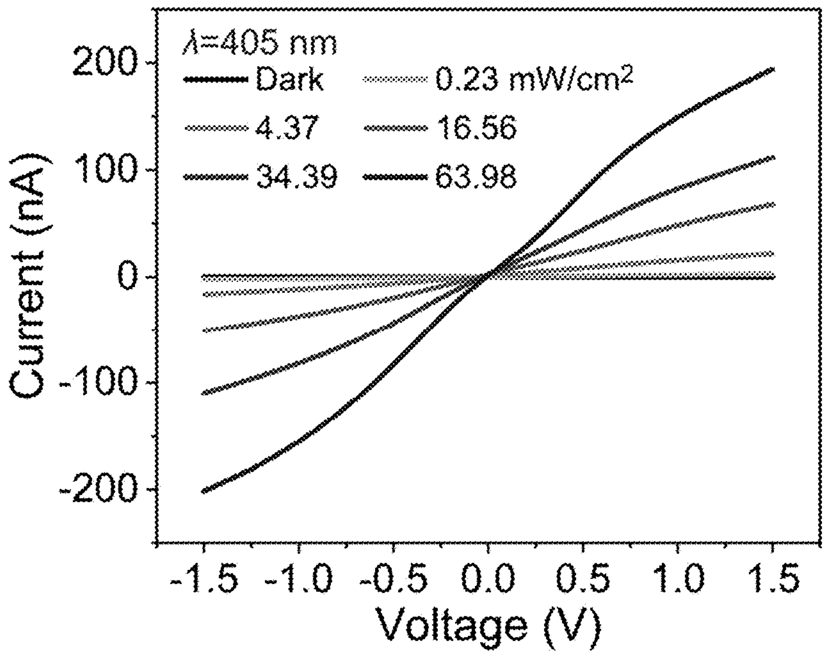
Figure 3E:
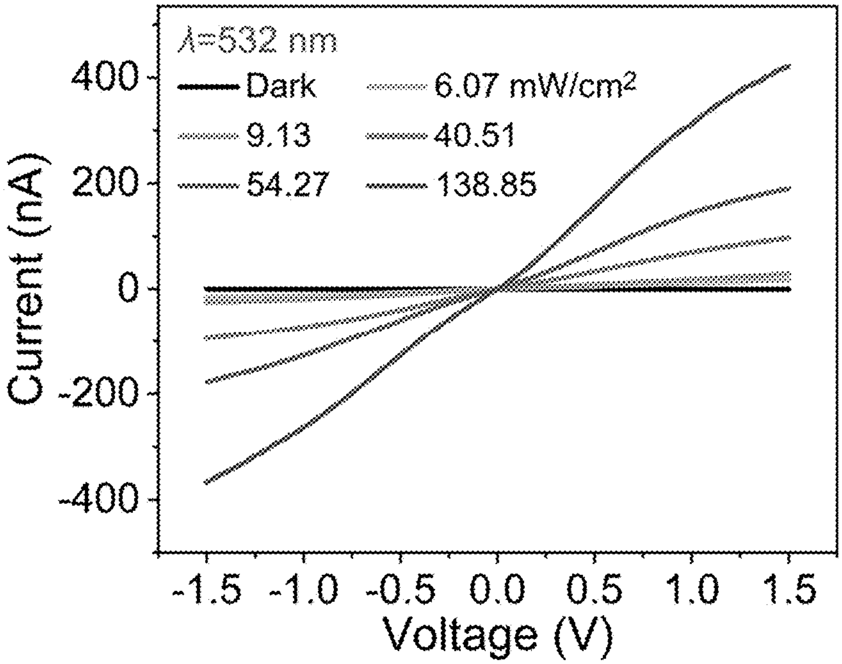
Figure 3F:
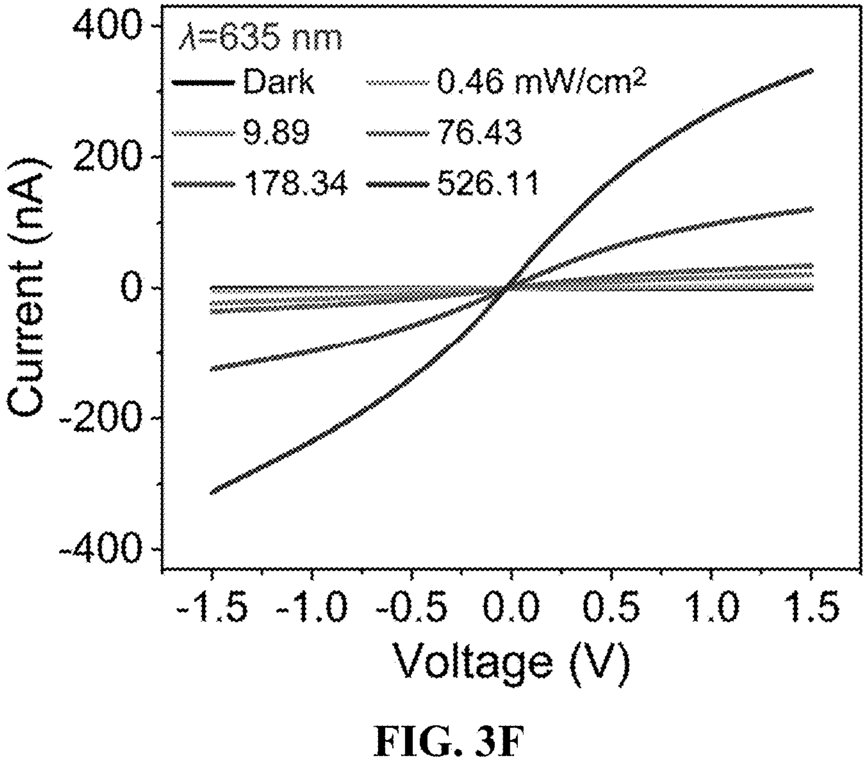

First, the spectral response of single-crystal $GAMA_2Pb_2I_7$ was measured with wavelength ranging from 400 nm to 800 nm under an applied voltage of −1.5 V bias (FIG. 3C). The photoresponsivity shows a wide-spectrum response with a cutoff wavelength close to 700 nm, which is consistent with the absorption spectra presented in FIG. 2A. After that, three different incident light wavelengths of 405, 532, and 635 nm were used to characterize the photodetection performance of the $GAMA_2Pb_2I_7$ photodetector. The current-voltage (I-V)

curves in the dark and under different illumination light intensities were recorded with a bias voltage of −1.5 V (FIGS. 3D-3F). The current increased dramatically when the device was illuminated by increasing light intensity. This phenomenon could be attributed to the stronger illumination, which will generate more photogenerated carriers and flow through the channel, causing higher photocurrent in the circuit.

Figure 4A:
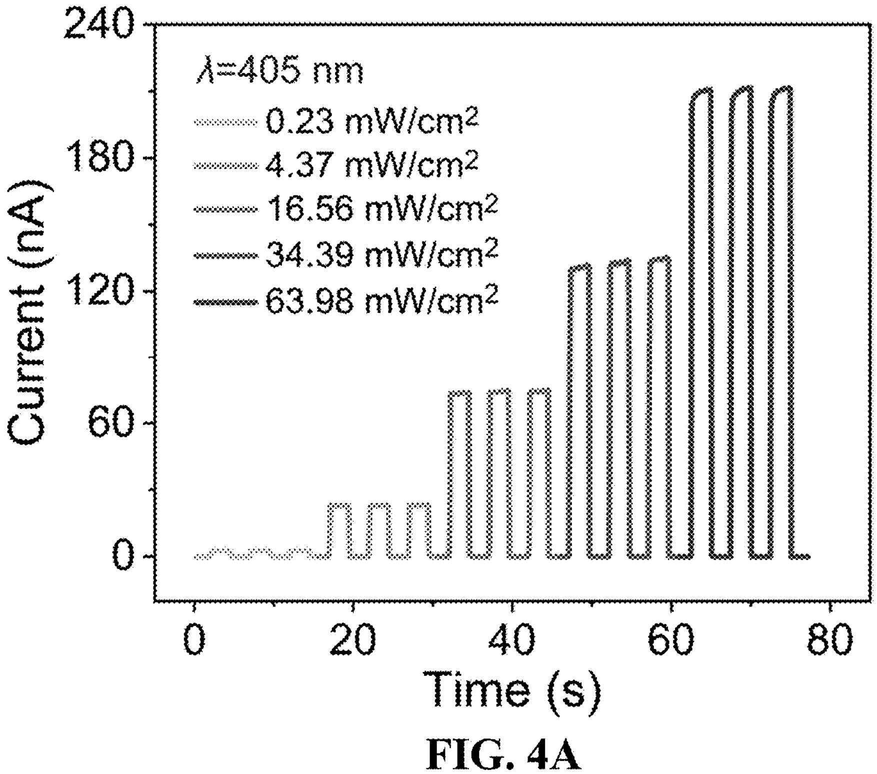
Figure 4B:
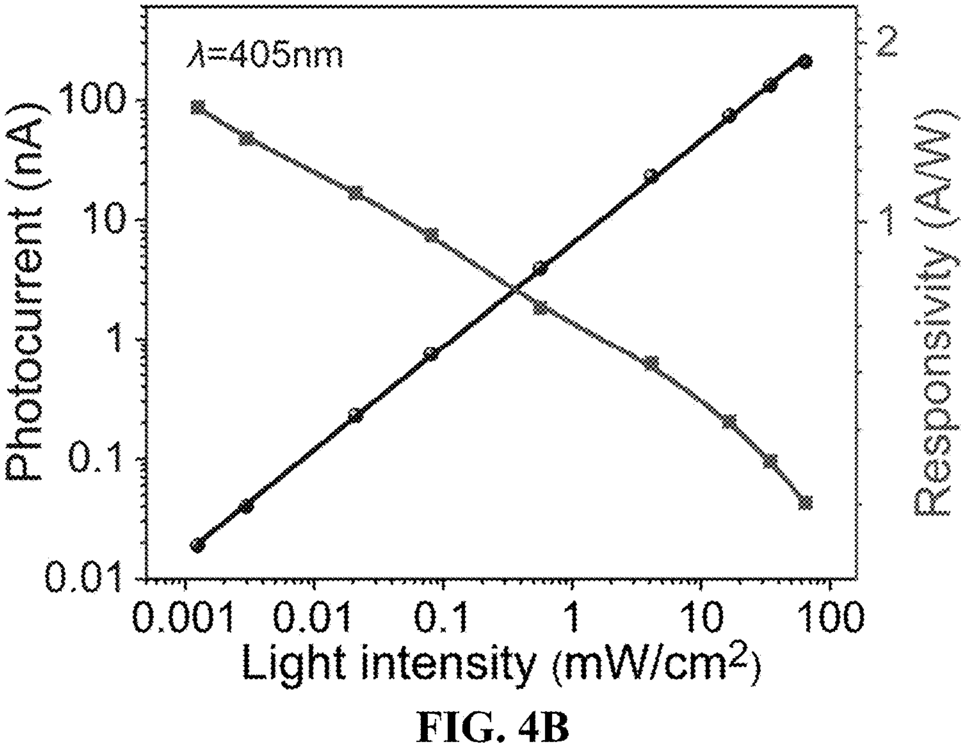
Figure 4C:
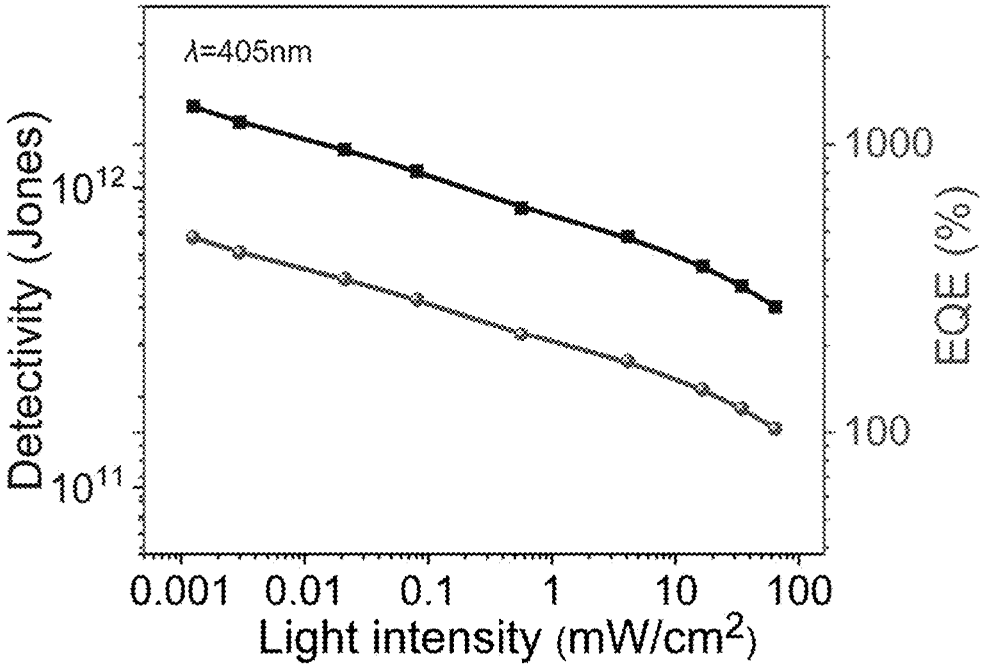
Figure 4D:
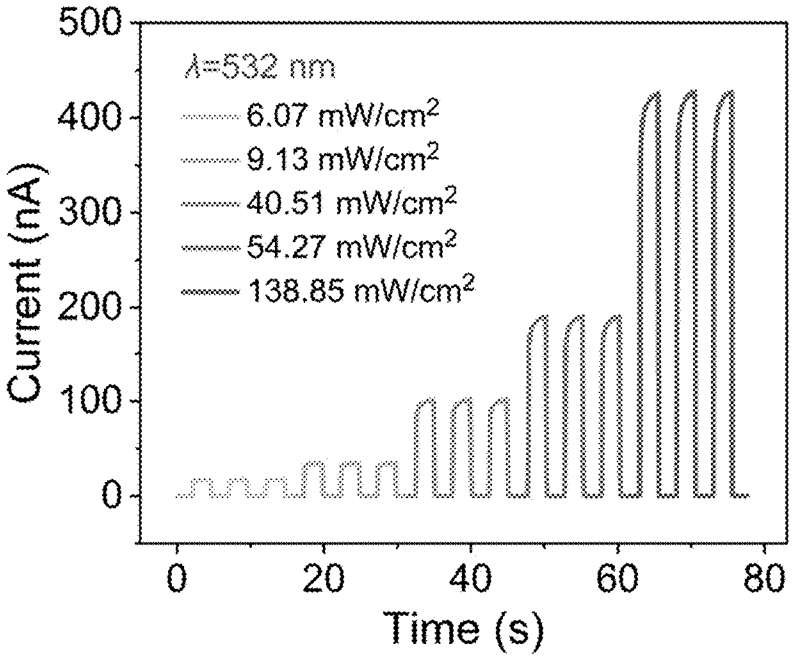
Figure 4E:
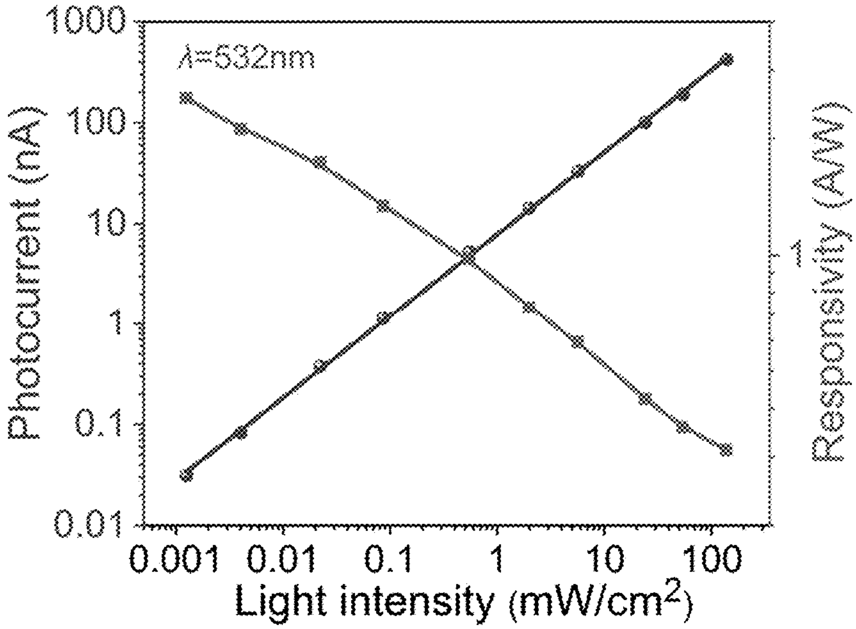
Figure 4F:
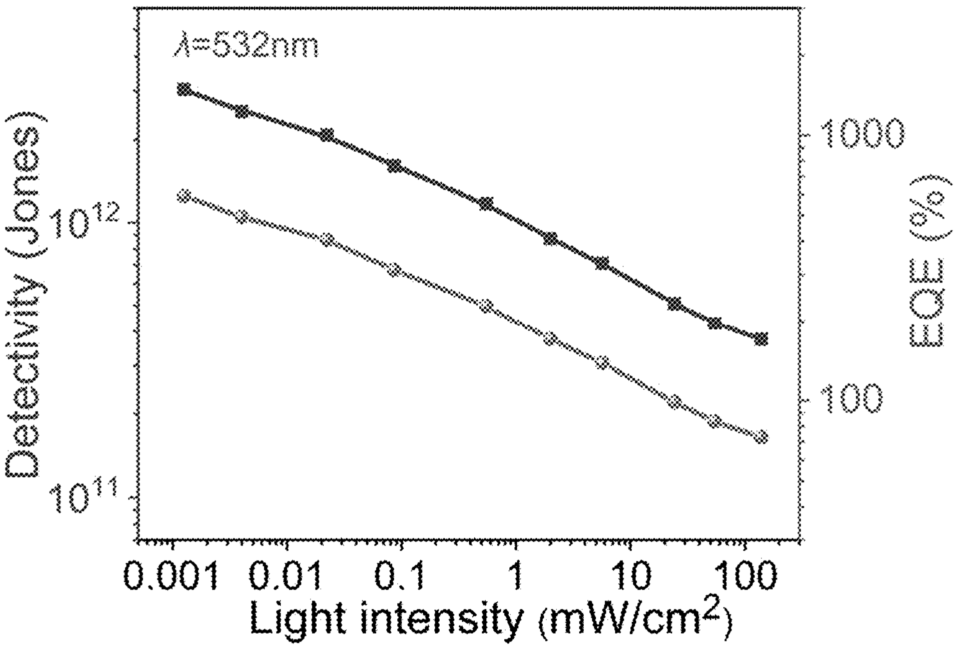
Figure 4G:
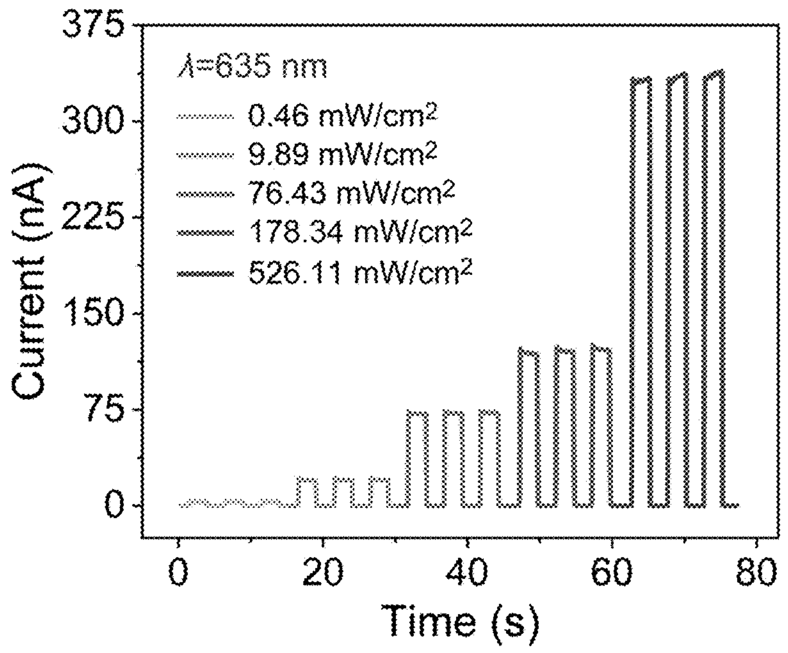

At the same time, the I-T curves of the $GAMA_2Pb_2I_7$ PDs were also recorded under different illumination of 405 nm, 532 nm, and 635 nm laser at −1.5 V (FIGS. 4A, 4D, and 4G). The measured current shows reproducible on-off switching behaviors under different incident wavelengths and different light illumination powers. The time-resolved I-T curves of PDs were measured by a high-speed photoresponse measurement circuit, by which the rise and decay times could be estimated from the precise photoresponse signals. The rise time is defined from 10% to 90%, and the decay time is estimated from 90% to 10% of the output signal maximum. As a result, both the rise and decay times are approximately 400 μs, though with different incident light wavelengths, suggesting the fast response of the device (FIGS. 9A-9C).

To understand the photoresponse behaviors, the incident light power versus photocurrent $I_{ph}$ ($I_{ph}=I_{on}-I_{dark}$) is compiled under the illumination of different wavelength light (FIGS. 4B, 4E, 4H), in which the relationship can be fitted by the formula 1:

$$I_{ph} = AP^x \quad (1)$$

where P represents the photocurrent, while x and A mean the fitting exponent and the scaling constant, respectively. Through fitting, the $I_{ph}$ shows a power dependence of 0.86, 0.81, and 0.70 under 405, 532, and 635 nm incident light. Such sublinear correlation between the $I_{ph}$ and the incident light intensity can be attributed to the intricate mechanisms involving exciton generation, trapping, and recombination, which are commonly witnessed in semiconducting materials.

Figure 4H:
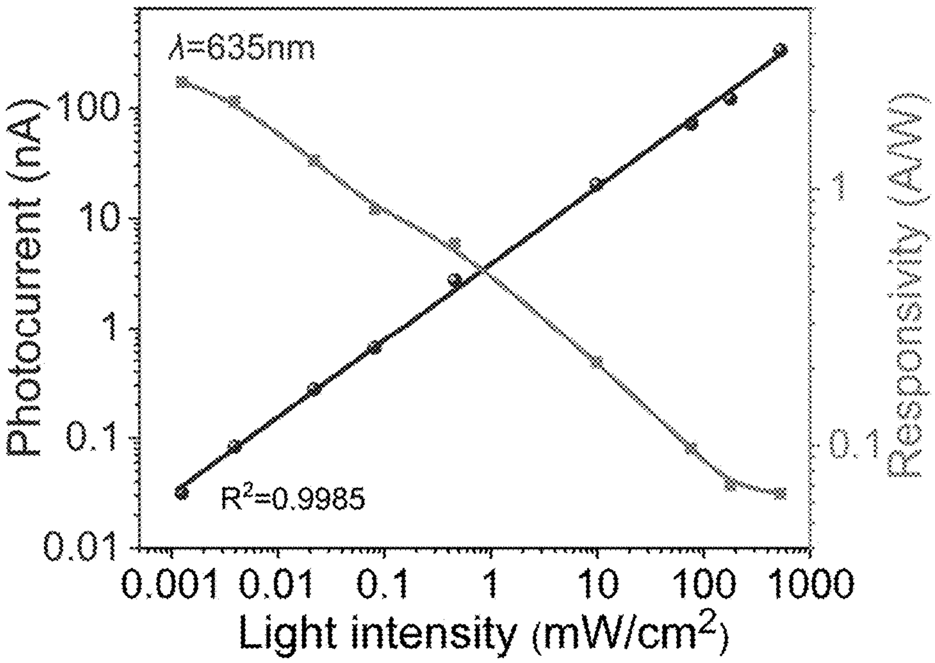

Besides, to further evaluate the photodetection performance of the $GAMA_2Pb_2I_7$ photodetector, the responsivity (R), detectivity (D*), and EQE were obtained by the following formulas:

$$R = \frac{I_{ph}}{Ps} \quad (2)$$

$$D^* = R\sqrt{\frac{S}{2qI_{dark}}} \quad (3)$$

$$EQE = \frac{hcR}{q\lambda} \quad (4)$$

where S is the active area of the photodetector, q is the absolute value of electron charge ($1.6\times10^{-19}$ C), $I_{dark}$ represents the dark current, h represents the Planck's constant, c means the velocity of light, and λ represents the incident wavelength. The light intensity-dependent R of the device under illumination with different light intensities were measured, as depicted in FIGS. 4B, 4E, and 4H. The high photoresponsivity of 1.56, 2.54, and 2.60 A/W could be achieved for the $GAMA_2Pb_2I_7$ photodetector under 405, 532, and 635 nm incident light under 9.82 nW, respectively, which is larger than that of most reported 2D RP and DJ hybrid perovskite single-crystal photodetectors, as tabulated in Table 1 below.

TABLE 1

| Material | Wavelength (nm) | Responsivity (A/W) | Detectivity (Jones) | Rise/decay time (μs) | Continuous irradiation test |
|---|---|---|---|---|---|
| $GAMA_2Pb_2I_7$ single crystal | 405 nm<br>532 nm<br>635 nm | 1.56<br>2.54<br>2.60 | $1.86 \times 10^{12}$<br>$3.04 \times 10^{12}$<br>$3.11 \times 10^{12}$ | 410/370<br>390/410<br>390/370 | Maintained 85.5% after 1000 s |
| $(BA)_2(MA)_2Pb_3Br_{10}$ single crystal | 420 | — | $3.6 \times 10^{10}$ | 150/570 | — |
| $(PEA)_2PbBr_4$ single crystal | 365 | $3.148 \times 10^{-2}$ | $1.55 \times 10^{13}$ | 410/370 | No significant degradation after 1000 s |
| $(BPA)_2PbBr_4$ Single crystal | 377 | $10^{-4}$ | $10^{7}$ | 27/30 | — |
| $BDAPbI_4$ Single crystal | 462 | $9.27 \times 10^{-1}$ | $1.23 \times 10^{11}$ | 187/163 | Maintained 96% after 250 s |
| $(2meptH_2)(MA)Pb_2I_7$ single crystal | 405 | 13 | — | 40/— | — |
| $(HDA)CsPb_2Br_7$ single crystal | 405 | $8.2 \times 10^{-5}$ | $8.1 \times 10^{8}$ | 200/300 | — |
| $(GA)(FA)PbI_4$ single crystal | 515 | $10^{-1}$ | $2 \times 10^{10}$ | 490/700 | — |

Figure 4I:
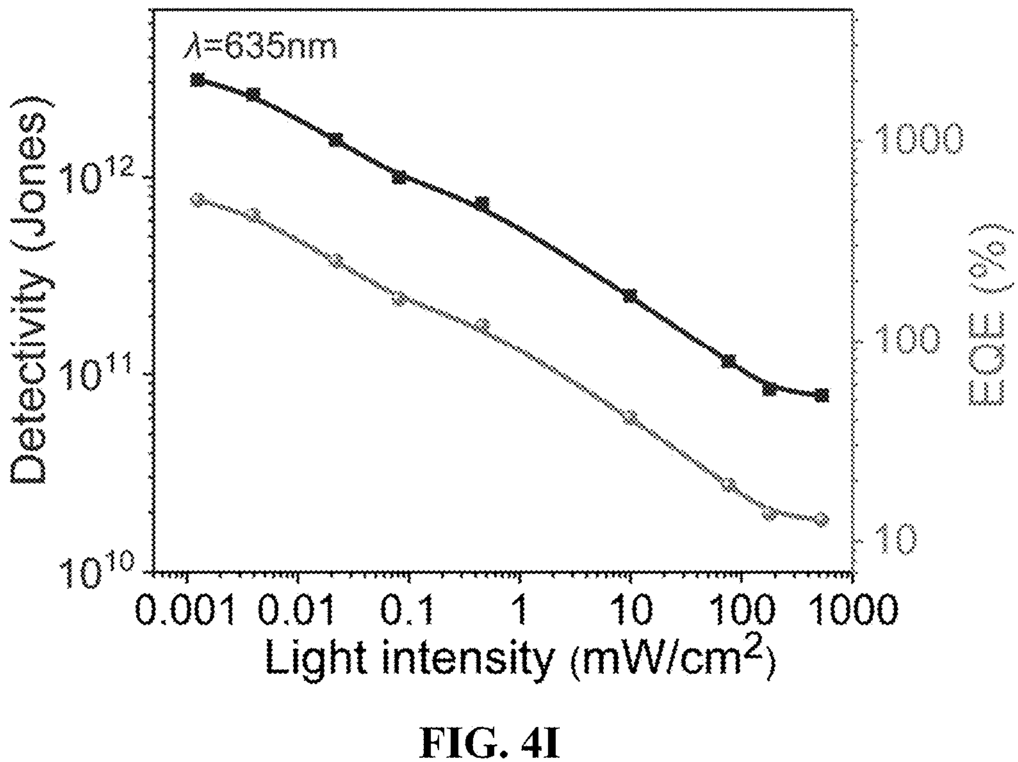

Furthermore, the D* and EQE under different light intensities were calculated and shown in FIGS. 4C, 4F, and 4I. The largest D* for the photodetectors under 405 nm, 532 nm, and 635 nm incident light is $1.86\times10^{12}$, $3.04\times10^{12}$, and $3.11\times10^{12}$ Jones and the corresponding EQE values are up to 477%, 592% and, 508%, respectively.

Moreover, the stability of organic-inorganic hybrid perovskite is essential for practical application. FIG. 10 shows the I-T curve of the $GAMA_2Pb_2I_7$ photodetector under 532 nm laser illumination in the ambient temperature (relative humidity is about 68%). The photocurrent maintained 85.5% of the initial performance after 1000 s operating durations.

The thermogravimetric analysis curve also shows high thermal stability up to 260° C. (FIG. 11). These results highlight the operation and thermal stability of the $GAMA_2Pb_2I_7$ crystals, which is beneficial to further practical utilizations.

Figure 5A:
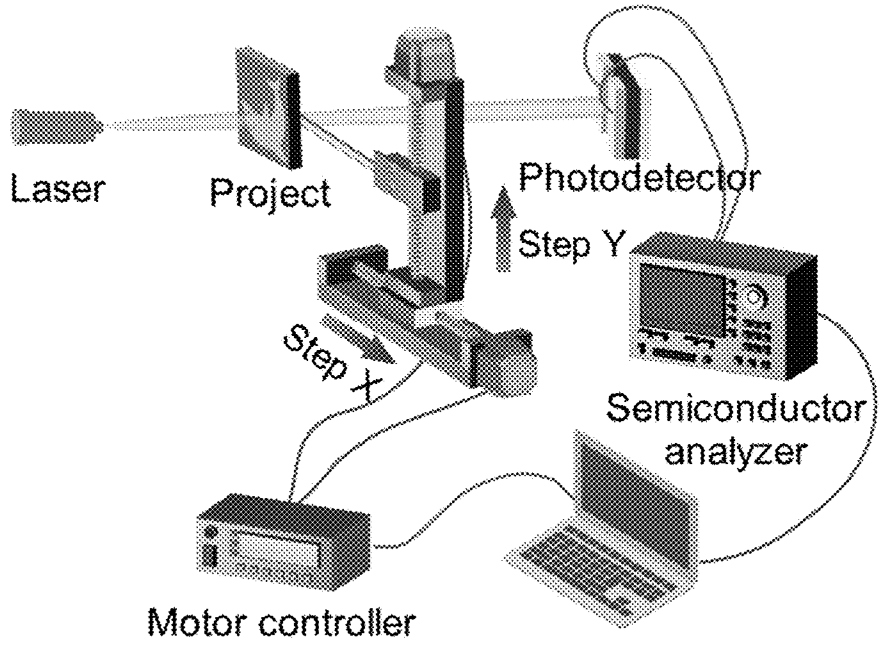
Figure 5B:
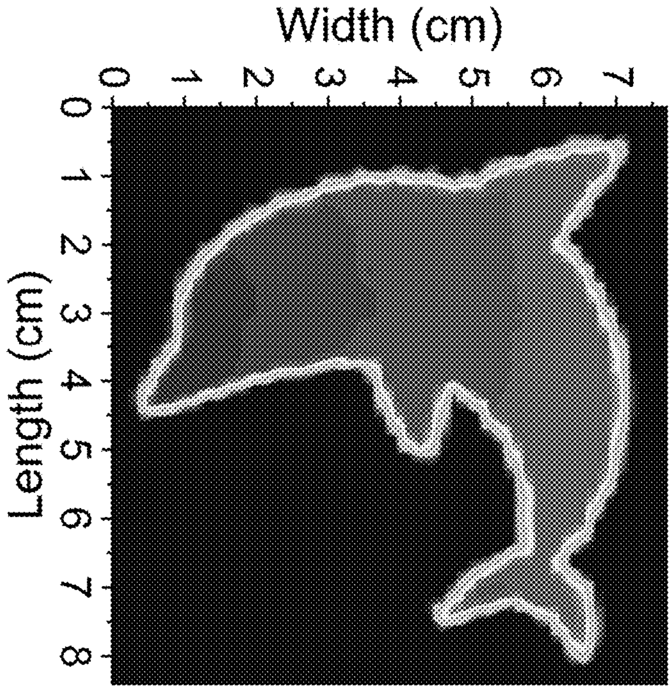

Based on the outstanding photosensitivity in the visible light region, the $GAMA_2Pb_2I_7$ photodetector holds excellent potential for imaging applications. Herein, a high-resolution imaging system is built based on the $GAMA_2Pb_2I_7$ photodetector. As shown in FIG. 5A, a laser with a wavelength of 532 nm was used to illuminate the imaging project (a hollow dolphin pattern), which can move sequentially along the X and Y directions. The $GAMA_2Pb_2I_7$ imaging sensor connected with a semiconductor analyzer was used to record the spatially resolved photocurrent. As a result, a high-resolution dolphin image could be extracted from the recorded photocurrent signal (FIG. 5B), showing the imaging system's good stability and light sensitivity. The above verifies the promising applications in the imaging system based on 2D bilayered hybrid perovskite with ACI phase.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

It should be understood that numerous specific details, relationships, and methods are set forth to provide a full understanding of the invention. One having ordinary skill in the relevant art, however, will readily recognize that the invention can be practiced without one or more of the specific details or practiced with other methods, protocols, reagents, cell lines and animals. The present invention is not limited by the illustrated ordering of acts or events, as some acts may occur in different orders and/or concurrently with other acts or events. Furthermore, not all illustrated acts, steps or events are required to implement a methodology in accordance with the present invention. Many of the techniques and procedures described, or referenced herein, are well understood and commonly employed using conventional methodology by those skilled in the art.

Unless otherwise defined, all terms of art, notations and other scientific terms or terminology used herein are intended to have the meanings commonly understood by those of skill in the art to which this invention pertains. In some cases, terms with commonly understood meanings are defined herein for clarity and/or for ready reference, and the inclusion of such definitions herein should not necessarily be construed to represent a substantial difference over what is generally understood in the art. It will be further understood that terms, such as those defined in commonly used dictionaries, should be interpreted as having a meaning that is consistent with their meaning in the context of the relevant art and/or as otherwise defined herein.

The invention claimed is:

1. A method of synthesizing two-dimensional bi-layered lead-halide hybrid perovskite single crystals with ACI (alternating cations in the interlayer) phase, comprising:

adding a guanidine salt, a methylamine component and a lead salt into a solution of hypophosphorous acid ($H_3PO_2$) water solution and hydroiodic acid (HI);

heating the mixture to a temperature of 220° C. to 240° C. and stirring to ensure a mixture of starting materials without precipitation; and cooling the mixture to a temperature of 15° C. to 25° C. to obtain a crystallized product;

wherein the crystallized product is a two-dimensional bi-layered lead-halide hybrid perovskite single crystal having a chemical formula of $GAMA_2Pb_2I_7$, wherein GA is $C(NH_2)_3$ and MA is $CH_3NH_3$ and;

wherein the yield of the two-dimensional bi-layered lead-halide hybrid perovskite single crystal product with ACI phase is at least 70% relative to Pb.

2. The method of claim 1, wherein the guanidine salt is selected from guanidine carbonate, guanidine hydrochloride, guanidinium bromide, guanidinium iodide or guanidine phosphate, or any combinations thereof.

3. The method of claim 1, wherein the methylamine component is selected methylamine, methylamine hydrochloride, methylammonium bromide, or any combinations thereof.

4. The method of claim 1, wherein the lead salt is selected from lead carbonate, lead iodide, lead bromide, lead chloride, lead (II) acetate trihydrate, or any combinations thereof.

5. The method according to claim 1, where the molar ratio of guanidine salt, lead salt and methylamine component is selected from a range of 1:1.5:1.5 to 1:2.5:2.5.

6. The method according to claim 1, wherein speed of cooling the mixture from a range of 65° C. to 85° C. to room temperature of 15° C. to 25° C. is 0.5° C./day to 2° C./day.

* * * * *